United States Patent
Chang et al.

(10) Patent No.: US 9,497,865 B2
(45) Date of Patent: Nov. 15, 2016

(54) PRINTED CIRCUIT BOARD AND FABRICATION METHOD THEREOF

(71) Applicant: NAN YA PCB Corporation, Taoyuan County (TW)

(72) Inventors: Hung-Wei Chang, Taoyuan County (TW); Tai-Yi Chou, Taichung (TW)

(73) Assignee: Nan Ya PCB Corp., Taoyuan County (TW)

( * ) Notice: Subject to any disclaimer, the term of this patent is extended or adjusted under 35 U.S.C. 154(b) by 413 days.

(21) Appl. No.: 14/043,609

(22) Filed: Oct. 1, 2013

(65) Prior Publication Data

US 2014/0216787 A1 Aug. 7, 2014

(30) Foreign Application Priority Data

Feb. 5, 2013 (TW) .............................. 102104325 A (51) Int. Cl.
H05K 3/46 (2006.01)
H05K 3/34 (2006.01)
H05K 3/00 (2006.01)

(52) U.S. Cl.
CPC .......... *H05K 3/4661* (2013.01); *H05K 3/3452* (2013.01); *H05K 3/0052* (2013.01); *H05K 2201/0909* (2013.01); *Y10T 29/49155* (2015.01)

(58) Field of Classification Search
USPC .......................................................... 174/250
See application file for complete search history.

(56) References Cited

U.S. PATENT DOCUMENTS

2001/0010303 A1* 8/2001 Caron ................. H05K 3/4691 216/18
2001/0037896 A1* 11/2001 Asai .................. H01L 23/49816 174/255

* cited by examiner

*Primary Examiner* — Timothy Thompson
*Assistant Examiner* — Krystal Robinson (57) ABSTRACT

A method for forming a printed circuit board includes providing a substrate including a first device region, a second device region and a dicing channel region between the first device region and the second device region. A first circuit is formed on the substrate. An insulating layer is formed on the first circuit and the substrate. At least one build-up circuit is formed on the insulating layer. A photoresist layer is formed on the at least one build-up circuit. An image transferring process is performed to pattern the photoresist layer to form a dam structure in the dicing channel region. A solder mask layer is formed on the at least one build-up circuit. The dam structure is removed to form a trench in the solder mask layer.

5 Claims, 13 Drawing Sheets

PRINTED CIRCUIT BOARD AND FABRICATION METHOD THEREOF

CROSS-REFERENCE TO RELATED APPLICATION

This Application claims priority of Taiwan Patent Application No 102104325, filed on Feb. 5, 2013, the entirety of which is incorporated by reference herein.

BACKGROUND OF THE INVENTION

1. Field of the Invention

This invention generally relates to a method for forming an electronic assembly, and more particularly, to a method for forming the printed circuit board.

2. Description of the Related Art

Printed circuited boards are widely used in electric equipment, such as cell phones, personal digital assistants, and thin film transistor liquid crystal devices. With development of technologies, the solder mask insulating layer of the printed circuit boards is required to have better uniformity to increase the yields of a solder paste printing process and micro solder ball printing process.

Figure 1A:
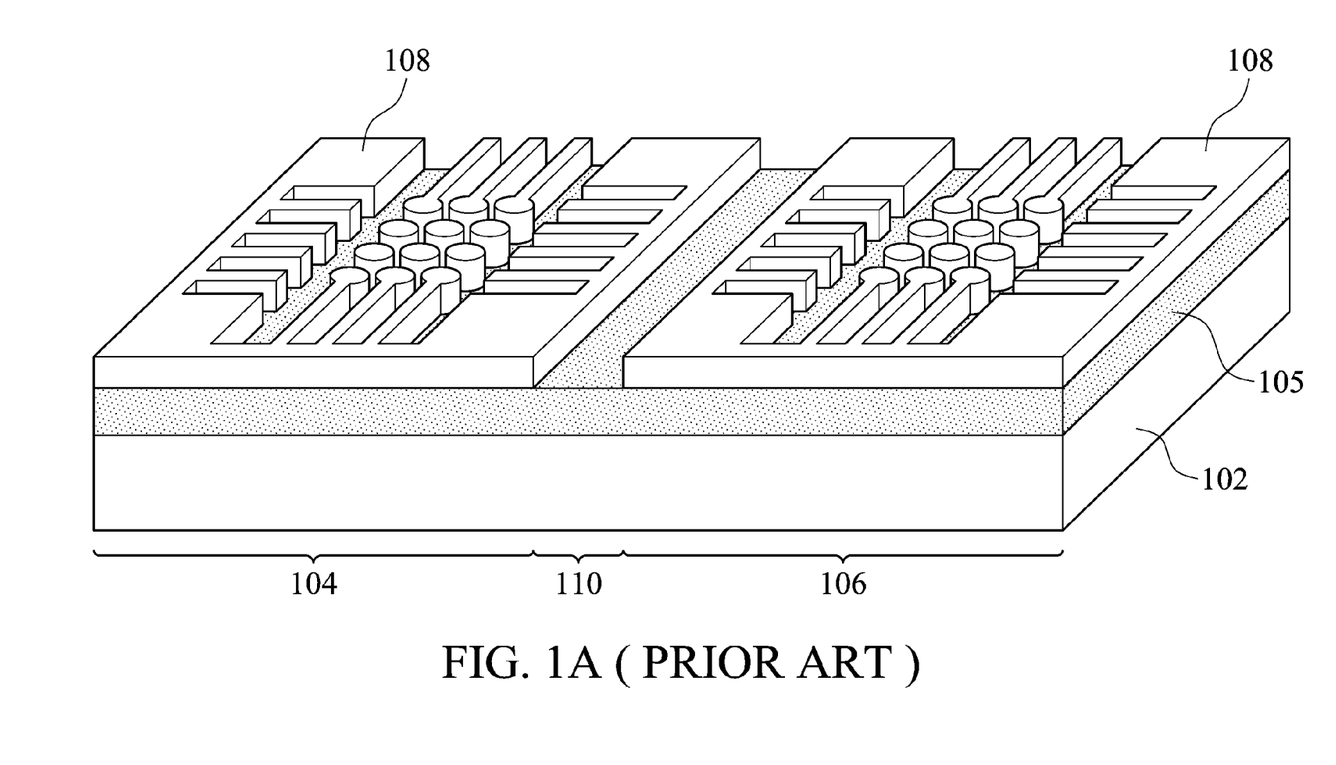
FIGS. 1A and 1B show three dimensional views of intermediate stages of a method for forming the printed circuit board of the conventional art.
Figure 1B:
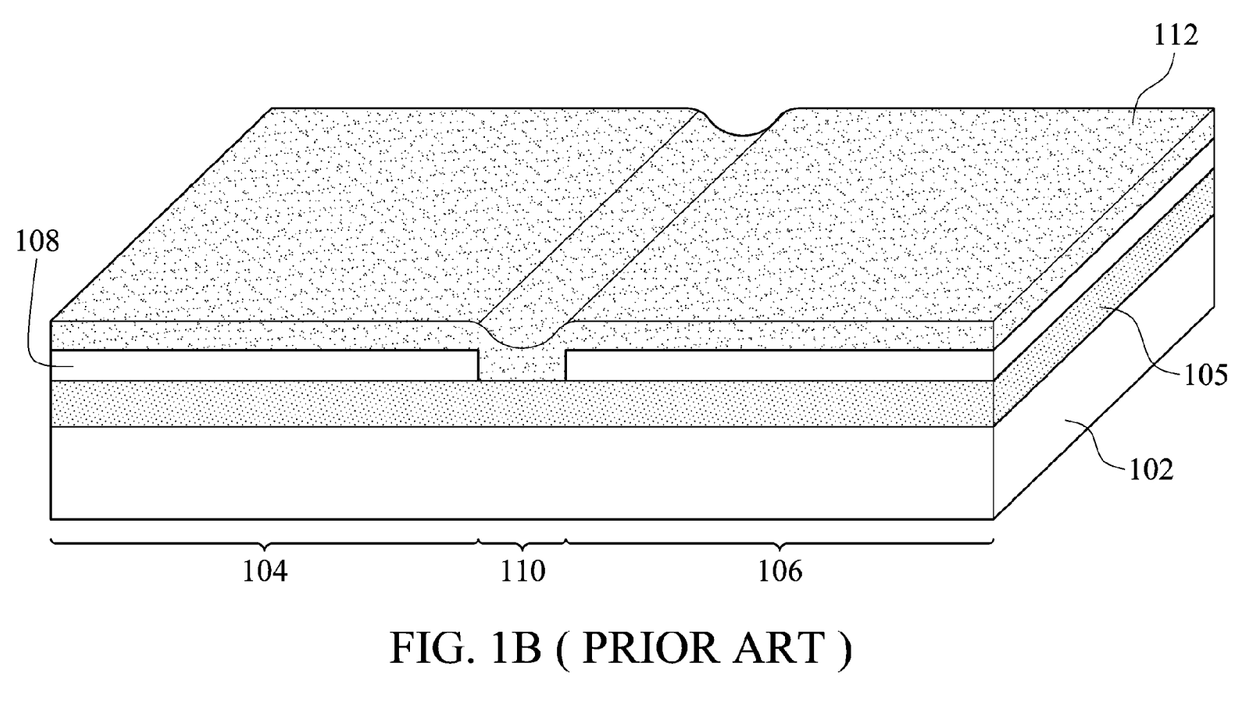

FIGS. 1A and 1B show three dimensional views of intermediate stages of a method for forming the printed circuit board of the conventional art. Referring to FIG. 1A, a substrate 102 is provided, wherein the substrate comprises a first device region 104, a second device region 106, and a dicing channel region 110 between the first device region 104 and the second device region 106. An insulating layer 105 is formed on the substrate 102. A circuit structure 108 is formed on the insulating layer 105, wherein the dicing channel region 110 between the first device region 104 and the second device region 106 does not comprise the circuit structure 108 for a subsequent dicing step to separate device units. Thereafter, referring to FIG. 1B, a solder mask layer 112 is coated on the circuit structure 108 and the insulating layer in the dicing channel region 110. However, as shown in FIG. 1B, since the top of the circuit structure 108 and the top of the insulating layer 105 in the dicing channel region 110 have a height difference. The coated solder mask layer 112 does not have a uniform thickness at the region neighboring the dicing channel region 110. Specifically, more serious sinking issues are generated for the solder mask layer 112 neighboring a cross of two dicing channel regions.

Therefore, a method for forming the printed circuit board which can eliminate the issue described previously is required.

BRIEF SUMMARY OF INVENTION

The invention provides a method for forming a printed circuit board. A substrate comprising a first device region, a second device region and a dicing channel region between the first device region and the second device region is provided. A first circuit is formed on the substrate. An insulating layer is formed on the first circuit and the substrate. At least one build-up circuit is formed on the insulating layer. A photoresist layer is formed on the at least one build-up circuit. An image transferring process is performed to pattern the photoresist layer to form a dam structure in the dicing channel region. A solder mask layer is formed on the at least one build-up circuit. The dam structure is removed to form a trench in the solder mask layer.

The invention further provides a printed circuit board, comprising a substrate, a first circuit on the substrate, an insulating layer on the first circuit and the substrate, at least one build-up circuit on the insulating layer, and a solder mask layer overlying the at least one build-up circuit, wherein the solder mask layer comprises a trench, and the trench has a vertical sidewall and the width of the trench is 30 µm~250 µm.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. In the drawings and specification, like or the same parts use the same symbols. The following discussion is only used to illustrate the invention, not limit the invention.

Figure 2A:
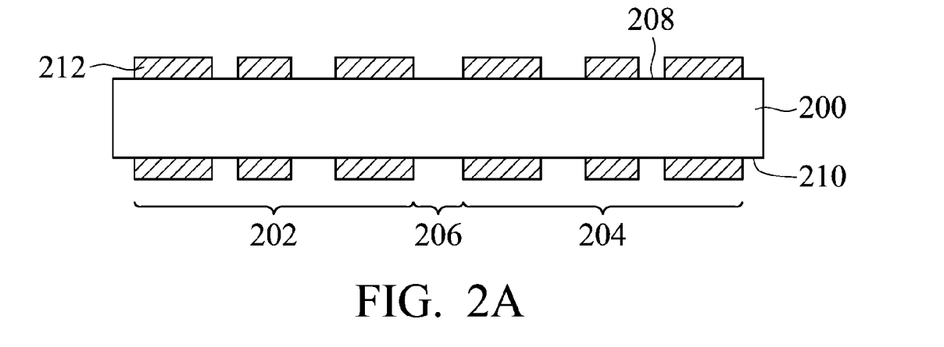
FIGS. 2A~2L show cross sections of intermediate stages of a method for forming the printed circuit board of an embodiment of the invention.

First, referring to FIG. 2A, a substrate 200 is provided, wherein the substrate 200 comprises a first surface 208 and a second surface 210 opposite to the first surface 208, and the substrate 200 further includes a first device region 202, a second device region 204 and a dicing channel region 206 between the first device region 202 and the second device region 204. The substrate 200 can have a core material of paper phenolic resin, composite epoxy, polyimide resin or glass fiber. A first circuit 212 is formed on the first surface 208 and the second surface 210 of the substrate 200. The first circuit 212 can comprises Ni, Au, Sn, Pb, Cu, Al, Ag, Cr, or W, or combinations thereof or alloys thereof. A method for forming the first circuit 212 comprises using standard deposition, pressing or coating processes to blanketly form a conductive layer (not shown) on the first surface 208 and the second surface 210 of the substrate 200. Next, an image transferring process, for example comprising covering of a resist, exposing and developing, is used to form a patterned photoresist layer (not shown), exposing a portion of the conductive layer. Thereafter, the conductive layer is etched to form the first circuit 212.

Figure 2B:
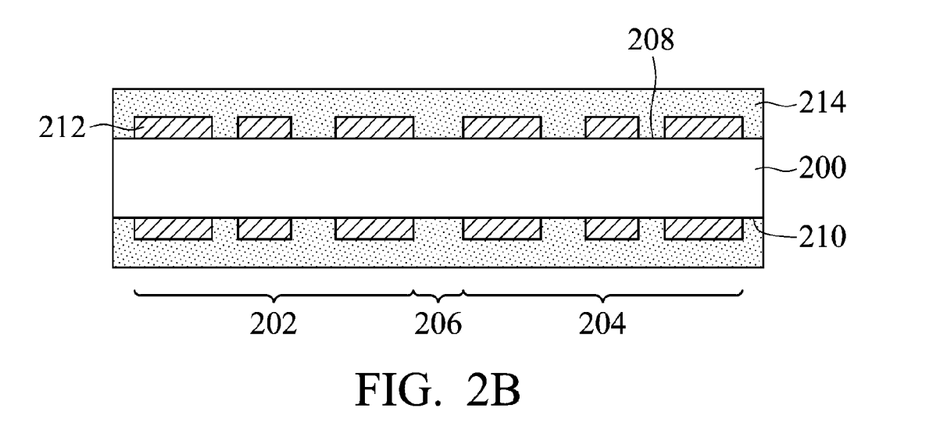

Next, referring to FIG. 2B, an insulating layer 214 is formed on the first surface 208 and the second surface 210 of a substrate 200, and on the first circuit 212. In an embodiment of the invention, the insulating layer 214 can be formed by pressing to be formed on the first surface 208 and the second surface 210 of the substrate 200. The insulating layer 214 can be epoxy resin, bismaleimie triacine (BT), polyimide (PI), ajinomoto build-up film (ABF), poly phenylene oxide (PPE), polypropylene (PP), polymethyl methacrylate (PMMA) or polytetrafluorethylene (PTFE).

Figure 2C:
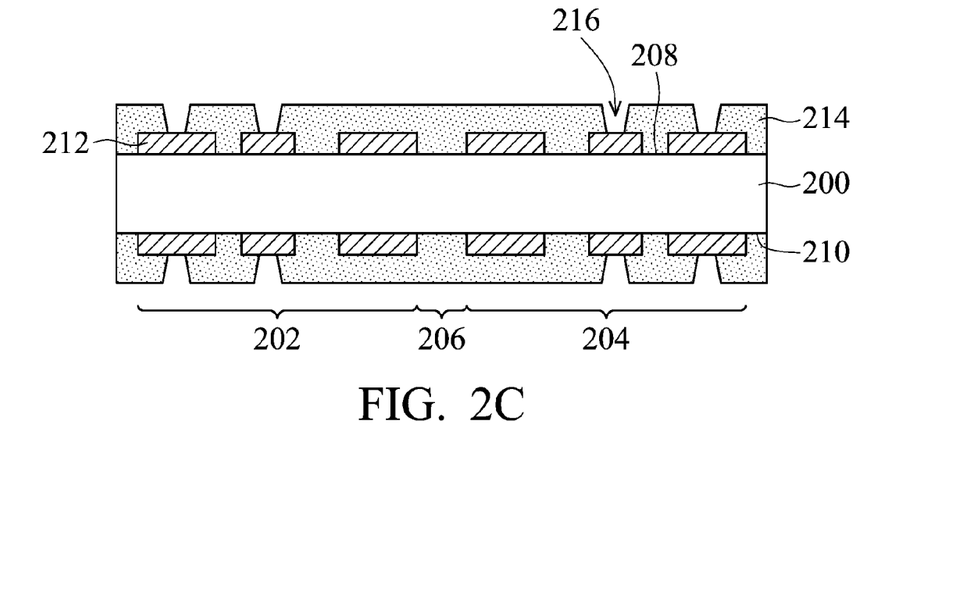

Referring to FIG. 2C, a method such as laser drilling can be used to form holes 216 in the insulating layer 214 on the first surface 208 and the second surface 210 of the substrate 200. In an embodiment of the invention, the holes 216 expose the first circuit 212 for forming conductive vias which electrically connect to the first circuit 212.

Figure 2D:
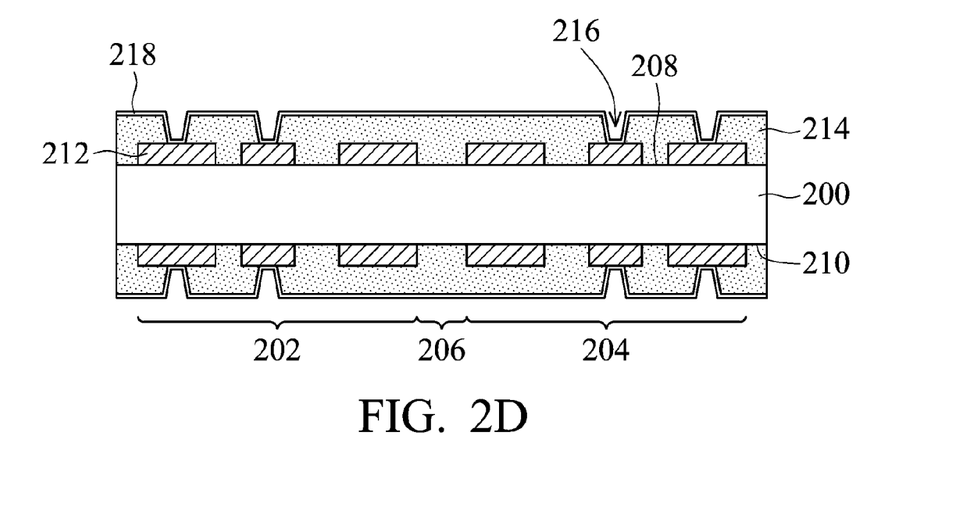

Referring to FIG. 2D, a chemical electroplating process is performed to form a seed layer 218 on the insulating layer 214 and the first circuit 212. In an embodiment, the seed layer 218 can be material with high conductivity, such as Ni, Au, Sn, Pb, Cu, Al, Ag, Cr, or W, or combinations thereof or alloys thereof. In an example, the seed layer 218 preferably is copper.

Figure 2E:
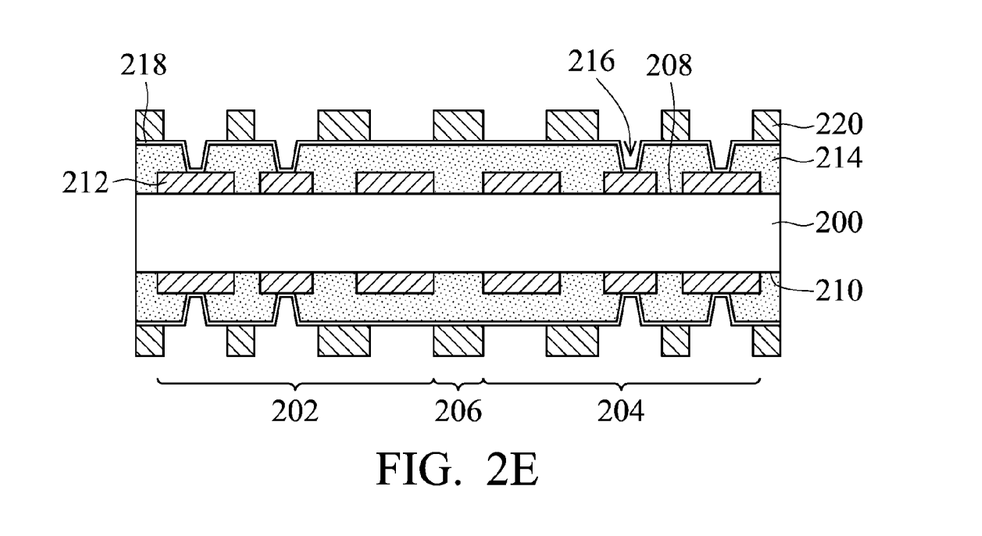
Figure 2F:
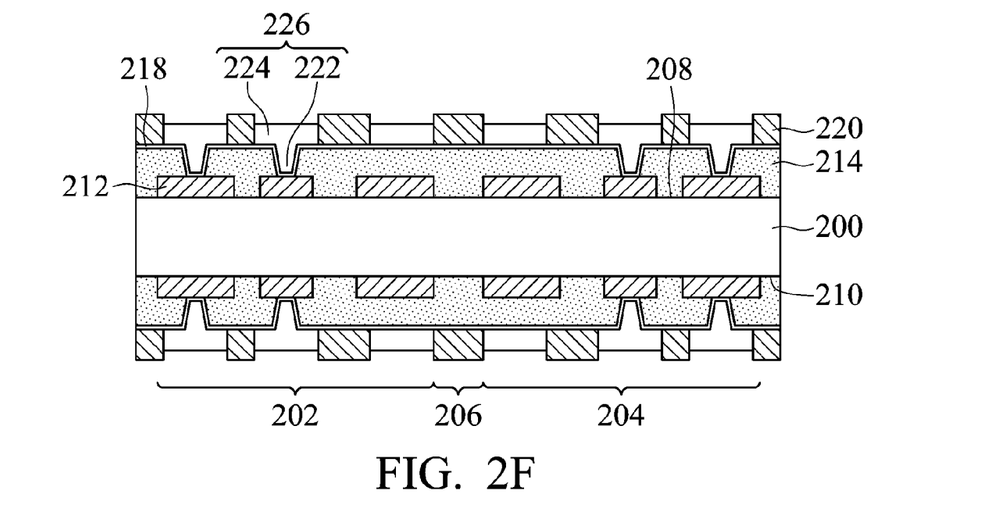

Referring to FIG. 2E, an image transferring process, for example comprising covering of a resist, exposing and developing, is used to form a patterned photoresist layer 220, exposing a portion of the seed layer 218. Next, referring to FIG. 2F, an electroplating process is performed using the seed layer 218 as a start layer to form a conductive layer filling the holes 216, and thus a build-up circuit 226 comprising conductive vias 222 and metal bumps 224 can be formed. In an embodiment, the conductive vias 222 and metal bumps 224 can be material with high conductivity, such as Ni, Au, Sn, Pb, Cu, Al, Ag, Cr, or W, or combinations thereof or alloys thereof. In an example, the conductive vias 222 and metal bumps 224 preferably are copper.

Figure 2G:
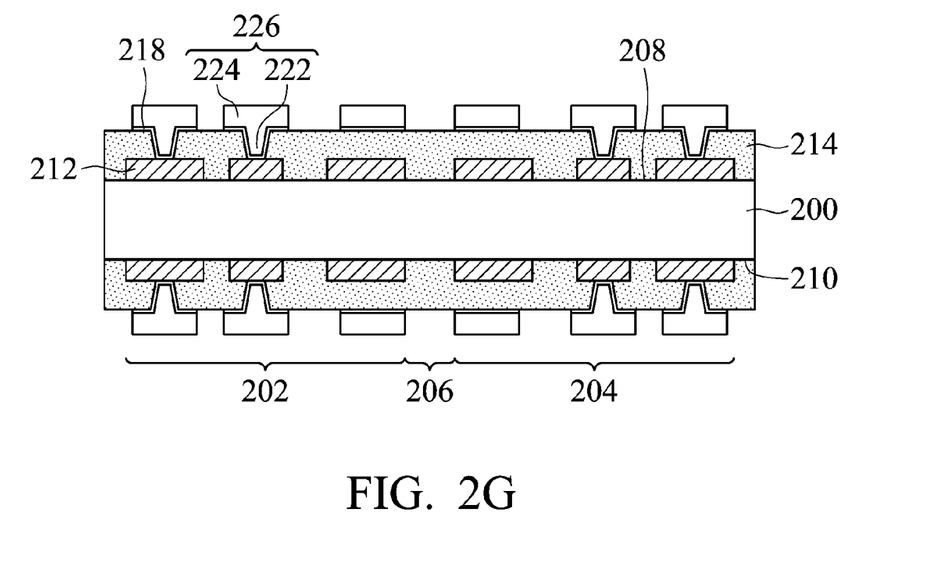

Next, referring to FIG. 2G, the patterned photoresist layer 220 formed in the aforementioned steps is removed and the outmost build-up circuit 226 is kept. It is noted that, for simplicity, only one build-up circuit, i.e. the outmost build-up circuit 226, overlying the first circuit 212 is mentioned. In real application, a plurality of build-up circuits is formed between the outmost build-up circuit 226 and the first circuit 212.

Figure 2H:
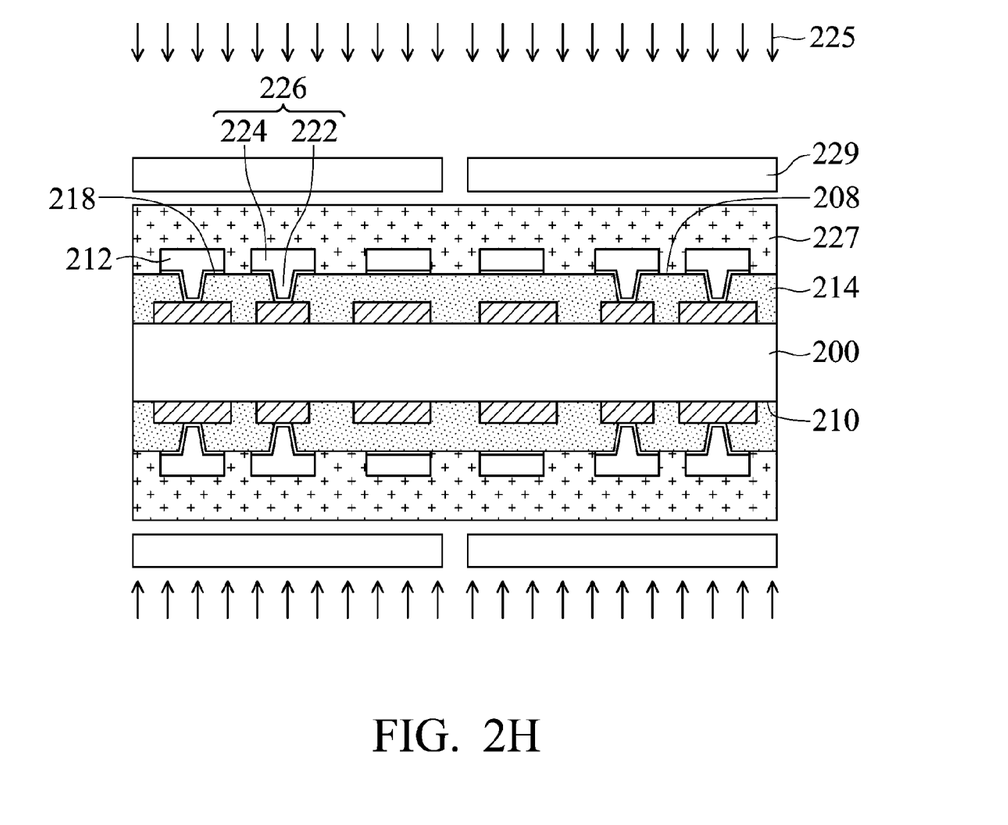
Figure 2I:
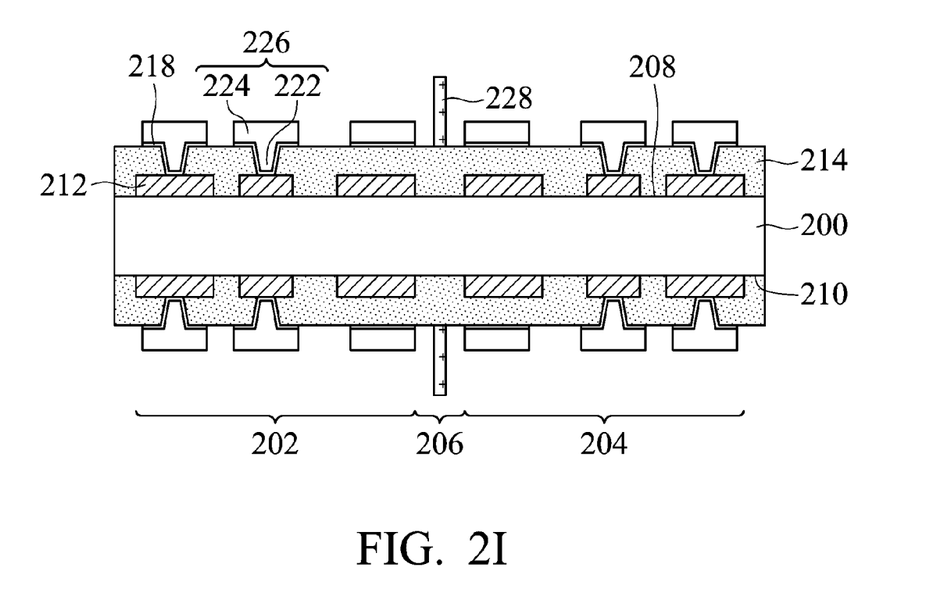
Figure 3:
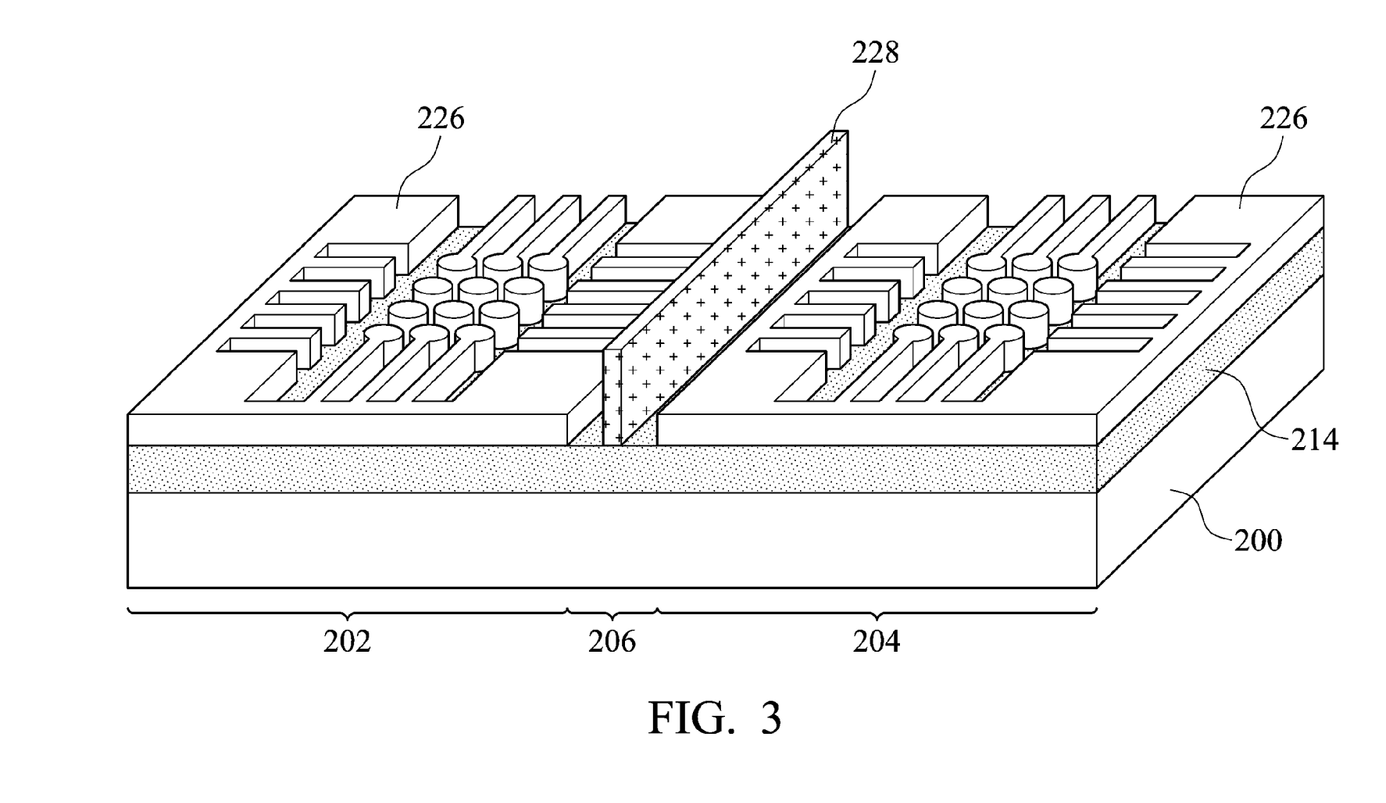
FIG. 3 shows a three dimensional view of an intermediate stage of a method for forming the printed circuit board of an embodiment of the invention.

Referring to FIG. 2H, a photoresist layer 227 is formed on the build-up circuit 226 and the insulating layer 214. In an embodiment, the photoresist layer 227 can be a dry film and it can be adhered to the build-up circuit 226 and the insulating layer 214. Next, an image transferring process is performed. For example, the photoresist layer 227 is exposed by light 225 to be solidified through a mask 229, and then a developing process is performed to remove the unexposed photoresist layer 227, leaving a dam structure 228 in the dicing channel region 206, as shown in FIG. 2I and FIG. 3 (FIG. 3 shows a three-dimensional view of a local area of FIG. 2I). It is noted that since the dam structure 228 is formed by image transferring in the embodiment, the dam structure 228 has a precise dimension. Furthermore, the trench formed by removing the dam structure in subsequent steps can have a well controlled size.

Figure 2J:
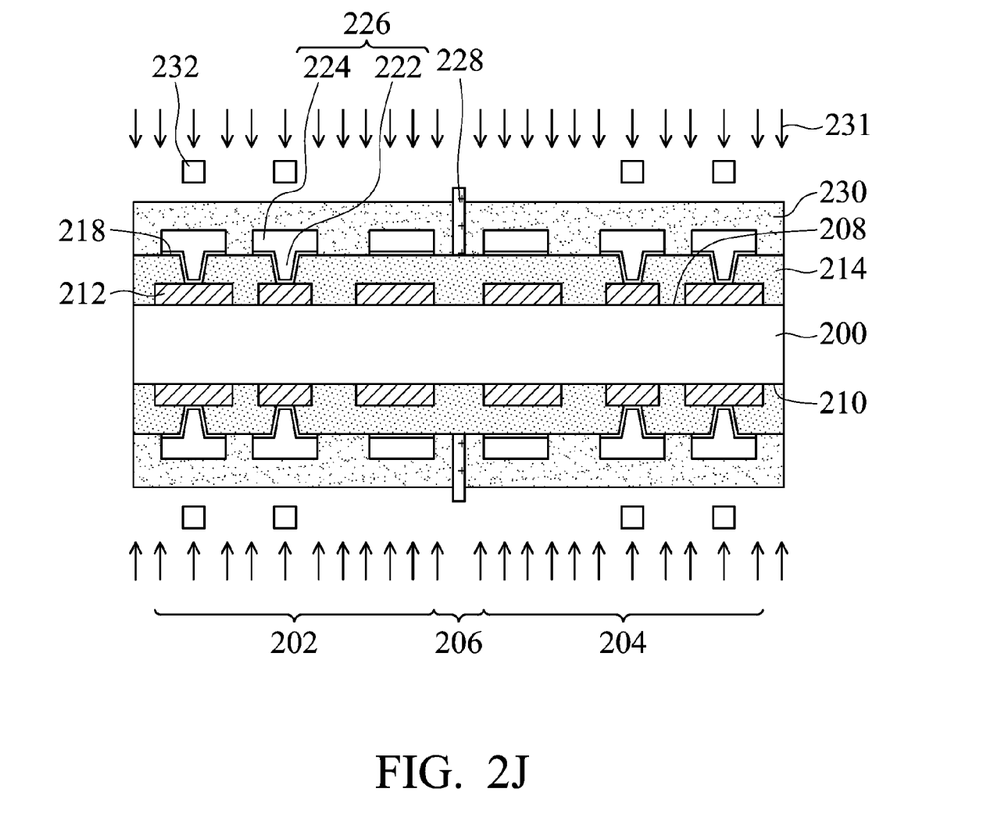
Figure 4:
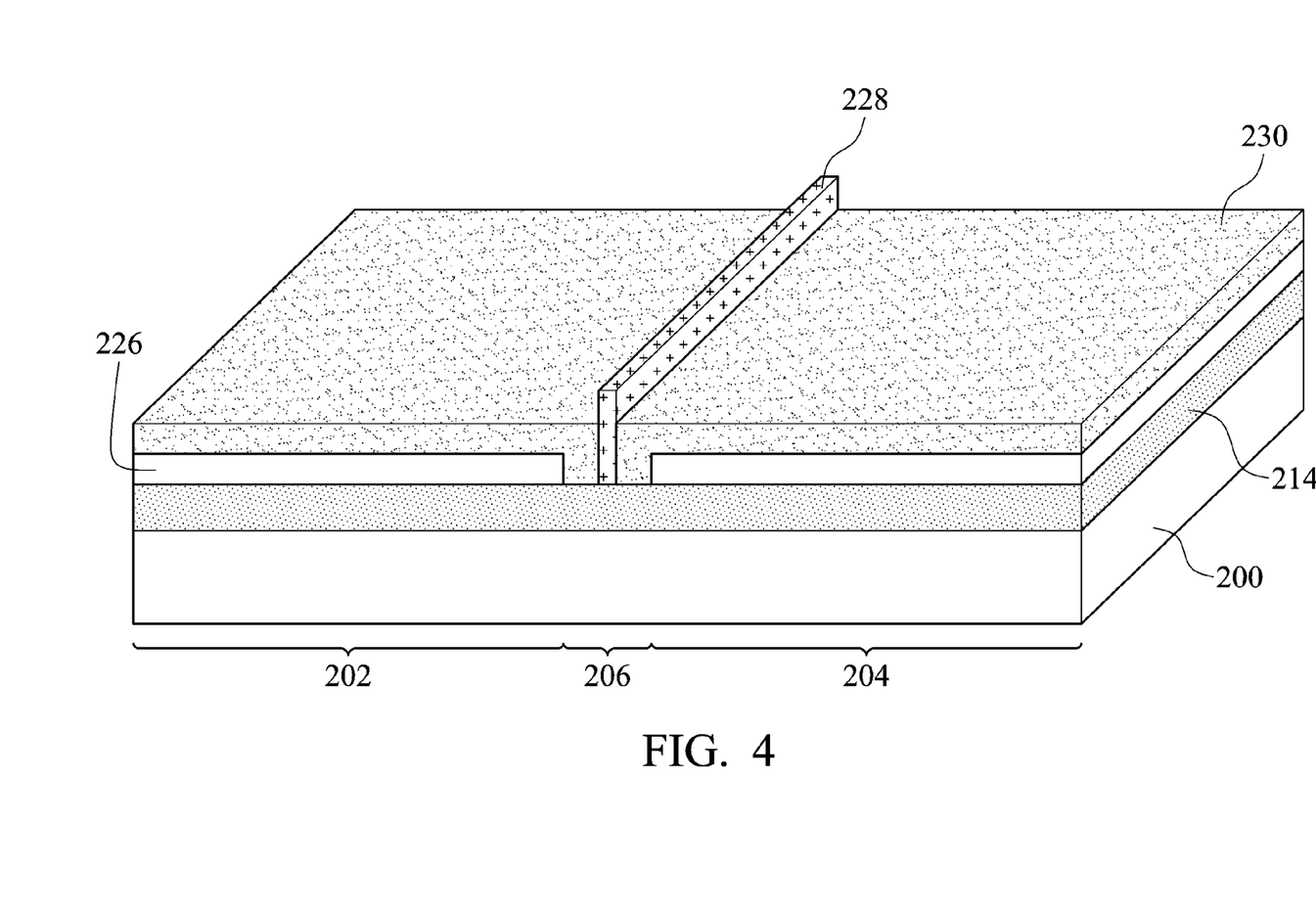
FIG. 4 shows a three dimensional view of an intermediate stage of a method for forming the printed circuit board of an embodiment of the invention.

Next, referring to FIG. 2J and FIG. 4 (FIG. 4 shows a three-dimensional view of a local area of FIG. 2J), a solder mask material is coated and then exposed to form a solder mask layer 230 on the outmost build-up circuit 226 and the insulating layer 214. As shown in FIG. 2J, the solder mask material beyond the area predetermined to form package contacts is exposed by light 231 through a mask 232 for forming package contacts. In an embodiment of the invention, the solder mask layer 230 can comprise a photosensitive material, such as epoxy resin with photosensitive groups, amidocarbonic acid or urethane resin. It is noted that since a dam structure 228 is formed in the embodiment and the solder mask layer 230 should closely contact sidewalls of the dam structure 228, the solder mask layer 230 does not sink at the area neighboring the dicing channel region 206. The embodiment forms a dam structure, for example comprising a dry film, in the dicing channel area after forming the outmost build-up circuit. The embodiment with help of the dam structure can eliminate the issue where the solder mask layer is too thin at the area close to the edge of the dicing channel and thus the solder mask layer can provide better insulation.

Figure 2K:
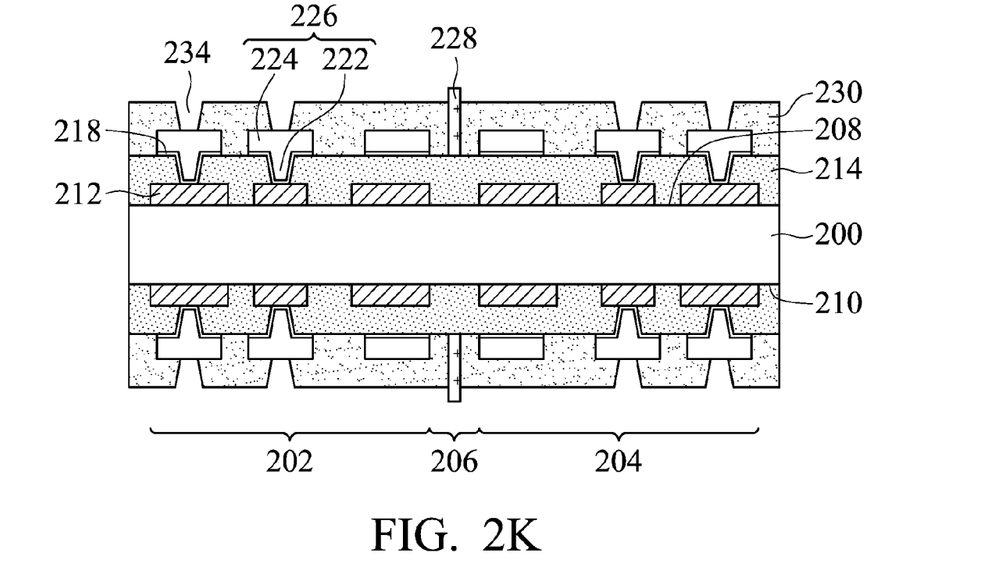
Figure 2L:
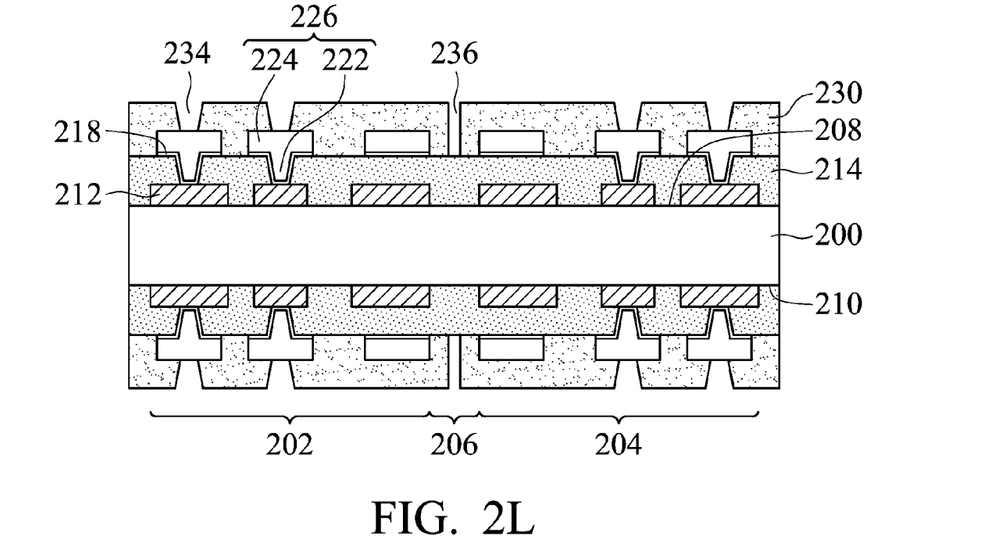
Figure 5:
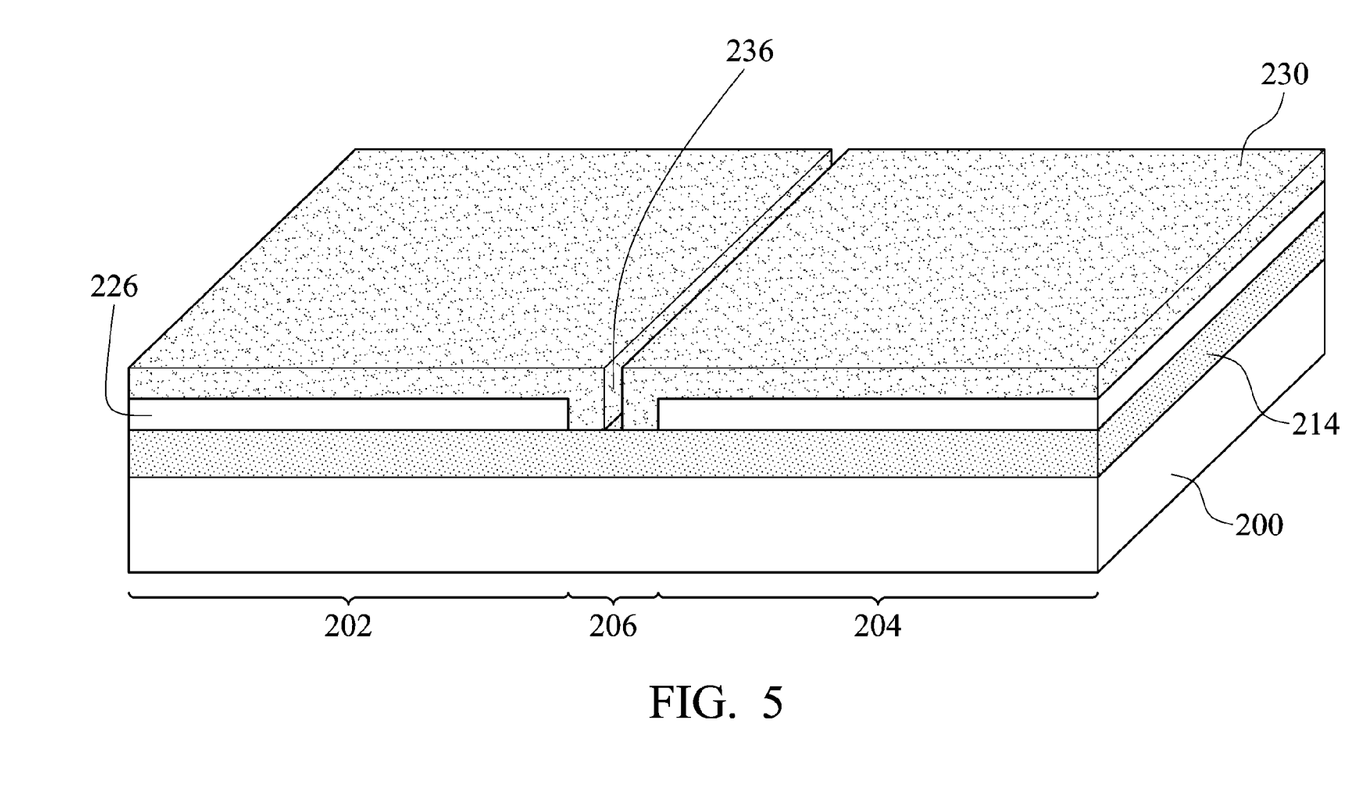
FIG. 5 shows a three dimensional view of an intermediate stage of a method for forming the printed circuit board of an embodiment of the invention.

Thereafter, referring to FIG. 2K, a development step is performed to form openings 234 exposing the outmost build-up circuit 226 in the solder mask layer 230 as package contacts. Referring to FIG. 2L and FIG. 5 (FIG. 5 shows a three-dimensional view of a local area of FIG. 2L), the dam structure 228 is removed to form a trench 236 in the dicing channel region 206 for dicing to separate neighboring devices. In an embodiment of the invention, the width of the trench 236 can be 30 μm~250 μm, and preferably is 50 μm~200 μm. In an embodiment, the dam structure 228 can be removed by plasma ashing or immersion of permanganate or alkaline liquid such as NaOH. According to the description above, since the solder mask material is solidified before removing the dam structure, the trench 234 formed by removing the dam structure 228 substantially has a vertical sidewalls and this feature can eliminate issues of a non-uniform solder mask layer at the area neighboring dicing channel regions. Furthermore, the trench in the solder mask layer formed by removing the dam structure can increase vacuum adhesion between a printed circuit board and equipment during backend processes. Thus, issues of bent substrates can be reduced.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board, comprising:
   a substrate;
   a first circuit on the substrate;
   an insulating layer on the first circuit and the substrate;
   at least one build-up circuit on the insulating layer; and
   a solder mask layer overlying the at least one build-up circuit, wherein the solder mask layer comprises a trench, and the trench has a vertical sidewall and width of the trench is 30 μm~250 μm,
   wherein the trench exposes the insulating layer.

2. The printed circuit board as claimed in claim 1, wherein width of the trench is 50 μm~200 μm.

3. The printed circuit board as claimed in claim 1, wherein the substrate comprises a first device region, a second device region and a dicing channel region between the first device region and the second device region, and wherein the dicing channel region is free of the first circuit and the build-up circuit, and the trench is disposed in the dicing channel region.

4. The printed circuit board as claimed in claim 1, wherein the solder mask layer is a photosensitive material.

5. The printed circuit board as claimed in claim 4, wherein the solder mask material comprises epoxy resin with photosensitive groups, amidocarbonic acid or urethane resin.

* * * * *